(12) United States Patent
Zhou et al.

(10) Patent No.: US 8,441,327 B2
(45) Date of Patent: May 14, 2013

(54) PRINTED CIRCUIT BOARD

(75) Inventors: Hua-Li Zhou, Shenzhen (CN); Ming Wei, Shenzhen (CN); Chia-Nan Pai, Taipei Hsien (TW); Shou-Kuo Hsu, Taipei Hsien (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 392 days.

(21) Appl. No.: 12/960,321

(22) Filed: Dec. 3, 2010

(65) Prior Publication Data

US 2012/0007688 A1 Jan. 12, 2012

(30) Foreign Application Priority Data

Jul. 12, 2010 (CN) .......................... 2010 1 0223746

(51) Int. Cl.
*H03H 7/38* (2006.01)
(52) U.S. Cl.
USPC ................................................ 333/33; 333/4
(58) Field of Classification Search .................. 333/1, 4, 333/5, 33, 238, 246
See application file for complete search history.

(56) References Cited

U.S. PATENT DOCUMENTS 7,157,987 B2 * 1/2007 Brunker et al. ................. 333/34
8,143,966 B2 * 3/2012 Merritt .............................. 333/1

* cited by examiner

*Primary Examiner* — Stephen Jones
(74) *Attorney, Agent, or Firm* — Altis Law Group, Inc.

(57) ABSTRACT

A printed circuit board includes an insulation layer and a signal layer attached to the insulation layer. The signal layer includes a pair of differential transmission lines. Width W of each of the differential transmission lines is changed according to change of space S between the differential transmission lines, based on the following formula:

$$W = C1 \times H \times \left(\frac{C2 \times H}{0.8W_0 + T}\right)^{\frac{C3 \times e^{\frac{C4 \times S_0}{H}} - 1}{1 - C3 \times e^{\frac{C4 \times S}{H}}}} - 1.25T$$

In above formula, C1=7.475, C2=5.98, C3=0.48, C4=−0.96, H is a thickness of the insulation layer, $W_0$ is an original width of each of the differential transmission lines, and $S_0$ is an original space between the differential transmission lines, and T is a thickness of each of the differential transmission lines.

6 Claims, 4 Drawing Sheets

PRINTED CIRCUIT BOARD

BACKGROUND

1. Technical Field

The present disclosure relates to printed circuit boards (PCBs), and particularly to a PCB with differential transmission lines.

2. Description of Related Art

Nowadays, many PCBs include differential transmission lines arranged in signal layers of the PCBs. When a pair of differential transmission lines needs to bypass voids, or connect to connection points, such as pads and golden fingers, with irregular structures, the space between the pair of differential transmission lines may change. However, the space between the pair of differential transmission lines is related to the impedance. When the space between the pair of differential transmission lines changes, the impedance of each pair of differential transmission lines will be changed accordingly, which may lead to the impedance of the pair of differential transmission lines becoming mismatched, thereby, affecting integrity of signal transmitted on the pair of differential transmission lines.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
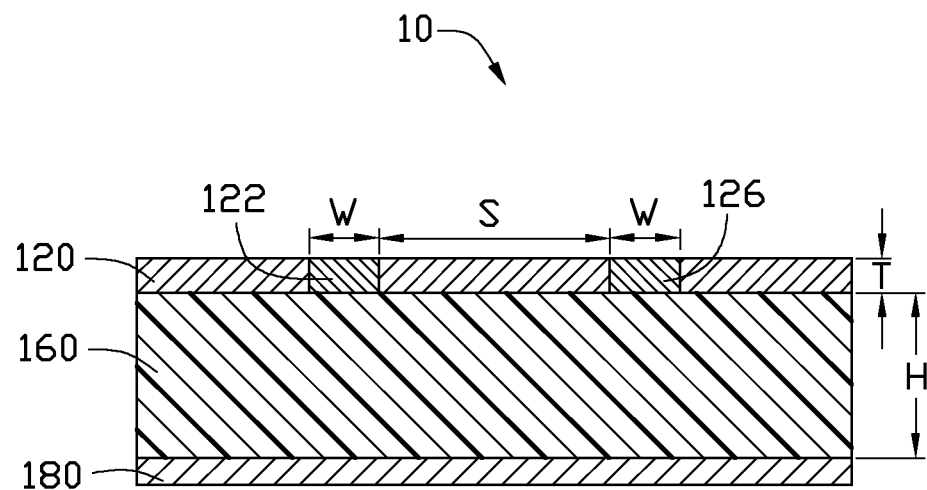
FIG. 1 is a schematic diagram of a printed circuit board (PCB), in accordance with a first embodiment, the printed circuit board including a pair of differential transmission lines.
Figure 3:
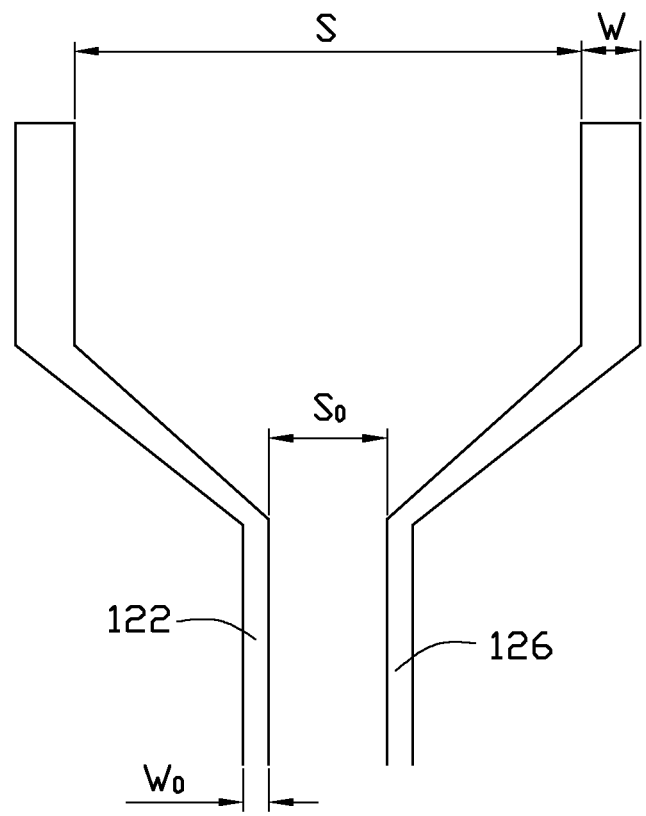
FIG. 3 is a schematic diagram of the pair of differential transmission lines of FIGS. 1 and 2, in accordance with a first embodiment.
Figure 4:
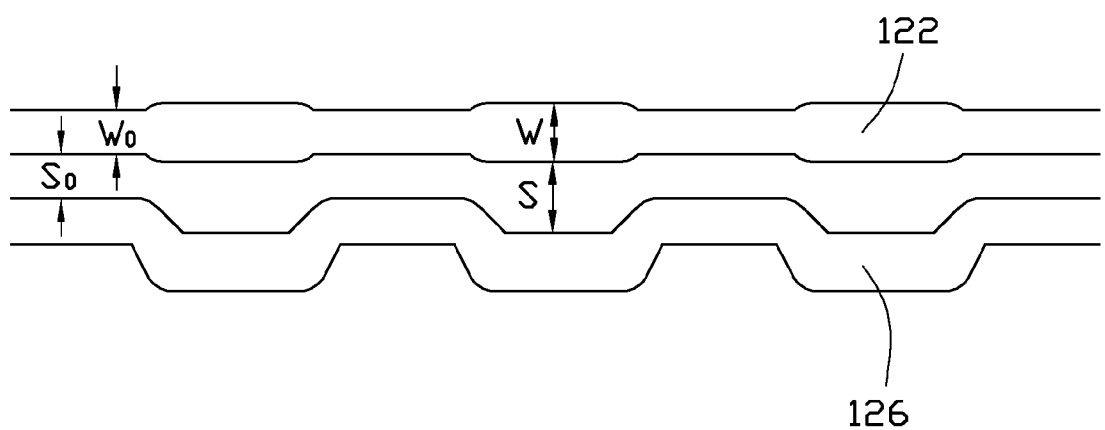
FIG. 4 is a schematic diagram of the pair of differential transmission lines of FIGS. 1 and 2, in accordance with a second embodiment.

Referring to FIGS. 1, 3 and 4, a first embodiment of a printed circuit board (PCB) 10 includes a signal layer 120, an insulation layer 160, and a reference layer 180. The signal layer 120 includes a pair of differential transmission lines 122 and 126 for transmitting differential signals. The insulation layer 160 is sandwiched between the signal layer 120 and the reference layer 180, to insulate the signal layer 120 from the reference layer 180. It may be understood that the reference layer 180 may be a power layer or a ground layer.

In present embodiment, each of the differential transmission lines 122 and 126 is a microstrip line. The thickness of each of the differential transmission lines 122 and 126 is T, the original width of each of the differential transmission lines 122 and 126 is $W_0$, and the original space between the differential transmission lines 122 and 126 is $S_0$. The insulation layer 160 is made of dielectric material, the dielectric constant of the insulation layer 160 is ∈, and the thickness of the insulation layer 160 is H. When the differential transmission lines 122 and 126 need to bypass voids (not shown), or connect to connection points, such as pads and golden fingers (not shown), with irregular structures, and when the differential transmission line 126 is set in serpentine routing (as shown in FIG. 4) to achieve length matching, the space between the differential transmission lines 122 and 126 changes to S, and the width of each of the differential transmission lines 122 and 126 changes to W.

It may be understood that, an impedance $Z_{Single}$ of a single microstrip line can be calculated by the following formula (formula 1):

$$Z_{Single} = \frac{87}{\sqrt{\varepsilon_\gamma + 1.41}} \ln\frac{5.98h}{0.8w + t},$$

and an impedance $Z_{Diff}$ of a pair of differential microstrip lines can be calculated by the following formula (formula 2):

$$Z_{Diff} = 2 \times Z_{Single} \times \left(1 - 0.48e^{\frac{-0.96s}{h}}\right).$$

According to formula 1 and formula 2, the following formula (formula 3) can be obtained:

$$Z_{Diff} = \frac{2 \times 87}{\sqrt{\varepsilon_\gamma + 1.41}} \ln\frac{5.98h}{0.8w + t}\left(1 - 0.48e^{\frac{-0.96s}{h}}\right).$$

In formulas 1-3, $\varepsilon_\gamma$ stands for a dielectric constant of an insulation layer, h stands for a thickness of the insulation layer, w stands for a width of each of the pair of differential microstrip lines, t stands for a thickness of each of the pair of differential microstrip lines, and s stands for a space between the pair of differential microstrip lines.

When the space between the differential transmission lines 122 and 126 is changed to S, and the width of each of the differential transmission lines 122 and 126 is changed to W, in order to maintain integrity of signal transmitted on the differential transmission lines 122 and 126, the impedance of the differential transmission lines 122 and 126 should remain the same. That is, the impedance of the differential transmission lines 122 and 126 should comply with the following formula (formula 4):

$$\frac{2 \times 87}{\sqrt{\varepsilon + 1.41}} \ln\frac{5.98H}{0.8W + T}\left(1 - 0.48e^{\frac{-0.96S}{H}}\right) =$$

$$\frac{2 \times 87}{\sqrt{\varepsilon + 1.41}} \ln\frac{5.98H}{0.8W_0 + T}\left(1 - 0.48e^{\frac{-0.96S_0}{H}}\right).$$

According to formula 4, in order to maintain the constant impedance of the differential transmission lines 122 and 126, the width W of each differential transmission lines 122 and 126 should be changed according to change of the space S between the differential transmission lines 122 and 126, based on the following formula (formula 5):

$$W = 7.475H \times \left(\frac{5.98H}{0.8W_0 + T}\right)^{\frac{0.48e^{\frac{-0.96S_0}{H}} - 1}{1 - 0.48e^{\frac{-0.96S}{H}}}} - 1.25T$$

Figure 2:
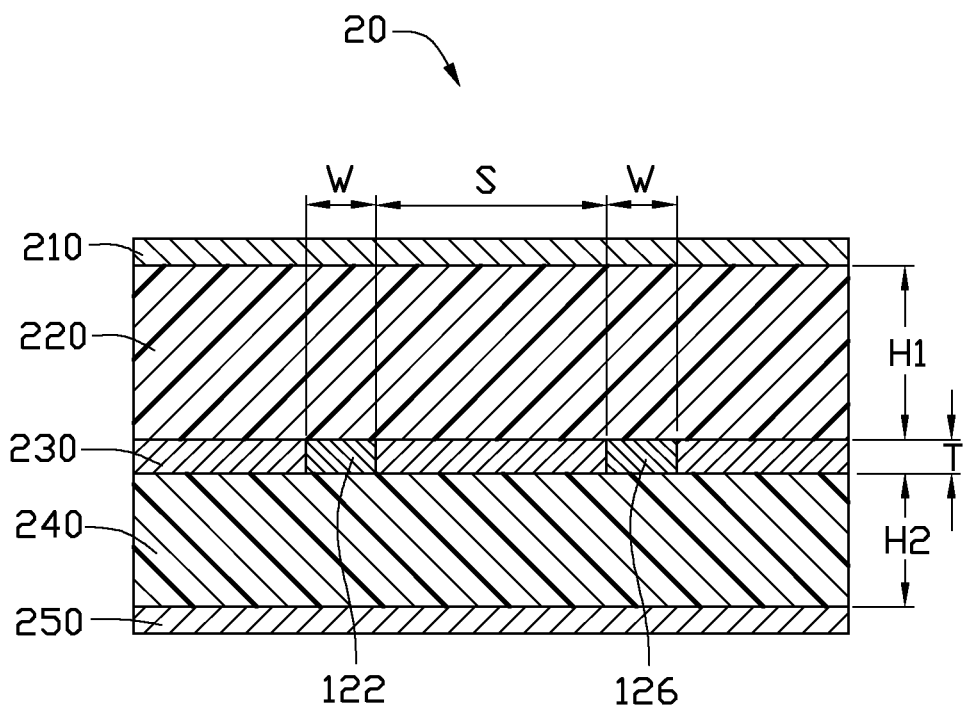
FIG. 2 is a schematic diagram of a printed circuit board (PCB), in accordance with a second embodiment, the printed circuit board including a pair of differential transmission lines.

Referring to FIGS. 2, 3 and 4, a second embodiment of a PCB 20 includes a first reference layer 210, a first insulation layer 220, a signal layer 230, a second insulation layer 240, and a second reference layer 250. The first insulation layer 220 is sandwiched between the first reference layer 210 and the signal layer 230, to insulate the first reference layer 210 from the signal layer 230. The second insulation layer 240 is sandwiched between the signal layer 230 and the second reference layer 250, to insulate the signal layer 230 from the second reference layer 250. The signal layer 230 includes a pair of differential transmission lines 122 and 126 for transmitting differential signals. It may be understood that each of the first reference layer 210 and the second reference layer 250 may be a power layer or a ground layer.

In present embodiment, each of the differential transmission lines 122 and 126 is a stripline. The thickness of each of the differential transmission lines 122 and 126 is T, the original width of each of the differential transmission lines 122 and 126 is $W_0$, and the original space between the differential transmission lines 122 and 126 is $S_0$. The first insulation layer 220 is made of semi-solid dielectric material, the dielectric constant of the first insulation layer 220 is $\in_1$, and the thickness of the first insulation layer 220 is H1. The second insulation layer 240 is made of solid dielectric material, the dielectric constant of the second insulation layer 240 is $\in_2$, and the thickness of the second insulation layer 240 is H2. When the differential transmission lines 122 and 126 need to bypass voids (not shown), or connect to connection points (not shown), such as pads and golden fingers, with irregular structures, and when the differential transmission line 126 is set in serpentine routing (as shown in FIG. 4) to achieve length matching, the space between the differential transmission lines 122 and 126 changes to S, and the width of each of the differential transmission lines 122 and 126 changes to W.

It may be understood that, an impedance $Z_{Single}$ of a single stripline can be calculated by the following formula (formula 6):

$$Z_{Single} = \frac{60}{\sqrt{\varepsilon_{\gamma(avg)}}} \ln \frac{1.9 b_{(synth)}}{0.8w + t},$$

and an impedance $Z_{Diff}$ of a pair of differential striplines can be calculated by the following formula (formula 7):

$$Z_{Diff} = 2 \times Z_{Single} \times \left(1 - 0.347 e^{\frac{-2.9s}{b_{(synth)}}}\right).$$

According to formula 6 and formula 7, the following formula (formula 8) can be obtained:

$$Z_{Diff} = \frac{2 \times 60}{\sqrt{\varepsilon_{\gamma(avg)}}} \ln \frac{1.9 b_{(synth)}}{0.8w + t} \left(1 - 0.347 e^{\frac{-2.9s}{b_{(synth)}}}\right).$$

In formulas 6-8, $$\varepsilon_{\gamma(avg)} = \frac{\varepsilon_{\gamma(h1)} \times h2 + \varepsilon_{\gamma(h2)} \times h1}{h1 + h2}, \quad b_{(synth)} = t + \frac{3h1 + h2}{2} \quad (h1 \geq h2),$$

$\in_{\gamma(avg)}$ stands for an equivalent dielectric constant, b(synth) stands for an equivalent thickness, w stands for a width of each of the pair of differential striplines, t stands for a thickness of each of the pair of differential striplines, s stands for a space between the pair of differential striplines, $\in_{\gamma(h1)}$ stands for a dielectric constant of a first insulation layer, $\in_{\gamma(h2)}$ stands for a dielectric constant of a second insulation layer, h1 stands for a thickness of the first insulation layer, and h2 stands for a thickness of the second insulation layer.

When the space between the differential transmission lines 122 and 126 is changed to S, and the width of each of the differential transmission lines 122 and 126 is changed to W, in order to maintain integrity of signal transmitted on the differential transmission lines 122 and 126, the impedance of the differential transmission lines 122 and 126 should remain the same. That is, the impedance of the differential transmission lines 122 and 126 should comply with the following formula (formula 9):

$$\frac{2 \times 60}{\sqrt{\varepsilon}} \ln \frac{1.9H}{0.8W + T} \left(1 - 0.347 e^{\frac{-2.9S}{H}}\right) =$$
$$\frac{2 \times 60}{\sqrt{\varepsilon}} \ln \frac{1.9H}{0.8W_0 + T} \left(1 - 0.347 e^{\frac{-2.9S_0}{H}}\right)$$

In formula 9, $$\varepsilon = \frac{\varepsilon_1 \times H2 + \varepsilon_2 \times H1}{H1 + H2}, \quad H = T + \frac{3H1 + H2}{2} \quad (H1 \geq H2),$$

$\in$ stands for an equivalent dielectric constant, and H stands for an equivalent thickness. According to formula 9, in order to maintain the constant impedance of the differential transmission lines 122 and 126, the width W of each differential transmission lines 122 and 126 should be changed according to change of the space S between the differential transmission lines 122 and 126, based on the following formula (formula 10):

$$W = 2.375H \times \left(\frac{1.9H}{0.8W_0 + T}\right)^{\frac{0.374 e^{\frac{-2.9S_0}{H}} - 1}{1 - 0.374 e^{\frac{-2.9S}{H}}}} - 1.25T$$

According to formula 5 and formula 10, it can be obtained that, in order to maintain the constant impedance of the differential transmission lines 122 and 126, the width W of each of the differential transmission lines 122 and 126 should be changed according to change of the space S between the differential transmission lines 122 and 126, based on the following formula (formula 11):

$$W = C1 \times H \times \left(\frac{C2 \times H}{0.8W_0 + T}\right)^{\frac{C3 \times e^{\frac{C4 \times S_0}{H}} - 1}{1 - C3 \times e^{\frac{C4 \times S}{H}}}} - 1.25T$$

In formula 11, C1 stands for a first parameter, C2 stands for a second parameter, C3 stands for a third parameter, C4 stands for a fourth parameter, H stands for s an equivalent thickness, T is a thickness of each of the differential transmission lines 122 and 126, $W_0$ is an original width of each of the differential transmission lines 122 and 126, and $S_0$ is an original space between the differential transmission lines 122 and 126. When each of the differential transmission lines 122 and 126 is a microstrip line, C1=7.475, C2=5.98, C3=0.48, C4=−0.96, H is the thickness of the insulation layer 160. When each of the differential transmission lines 122 and 126 is a stripline, C1=2.375, C2=1.9, C3=0.347, C4=−2.8, $$H = T + \frac{3H1 + H2}{2},$$

H1 is the thickness of the first insulation layer 220, and H2 is the thickness of the second insulation layer 240.

In present disclosure, when the space S between the differential transmission lines 122 and 126 is changed, the width W of each of the differential transmission lines 122 and 126 changes according to formula 11, to maintain the constant impedance of the differential transmission lines 122 and 126. Therefore, integrity of signals transmitted on the differential transmission lines 122 and 126 is ensured.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board comprising:
   an insulation layer; and
   a signal layer attached to the insulation layer, the signal layer comprising a pair of differential transmission lines, wherein width W of each of the differential transmission lines is changed according to change of space S between the differential transmission lines, based on the following formula:

$$W = C1 \times H \times \left(\frac{C2 \times H}{0.8W_0 + T}\right)^{\frac{C3 \times e^{\frac{C4 \times S_0}{H}} - 1}{1 - C3 \times e^{\frac{C4 \times S}{H}}}} - 1.25T$$

wherein C1=7.475, C2=5.98, C3=0.48, C4=−0.96, H is a thickness of the insulation layer, $W_0$ is an original width of each of the differential transmission lines, and $S_0$ is an original space between the differential transmission lines, and T is a thickness of each of the differential transmission lines.

2. The printed circuit board of claim 1, wherein each of the differential transmission lines is a microstrip line.

3. The printed circuit board of claim 1, wherein one of the differential transmission lines is set in serpentine routing in the signal layer.

4. A printed circuit board comprising:
   a first insulation layer;
   a second insulation layer; and
   a signal layer sandwiched between the first insulation layer and the second insulation layer, the signal layer comprising a pair of differential transmission lines, wherein width W of each of the differential transmission lines is changed according to change of space S between the differential transmission lines, based on the following formula:

$$W = C1 \times H \times \left(\frac{C2 \times H}{0.8W_0 + T}\right)^{\frac{C3 \times e^{\frac{C4 \times S_0}{H}} - 1}{1 - C3 \times e^{\frac{C4 \times S}{H}}}} - 1.25T$$

wherein C1=2.375, C2=1.9, C3=0.347, C4=−2.8, $W_0$ is an original width of each of the differential transmission lines, and $S_0$ is an original space between the differential transmission lines, T is a thickness of each of the differential transmission lines, and $$H = T + \frac{3H1 + H2}{2},$$

wherein H1 is a thickness of the first insulation layer, and H2 is a thickness of the second insulation layer.

5. The printed circuit board of claim 4, wherein each of the differential transmission lines is a stripline.

6. The printed circuit board of claim 4, wherein one of the differential transmission lines is set in serpentine routing in the signal layer.

* * * * *